United States Patent [19]
Matsumoto et al.

[11] Patent Number: 6,163,037
[45] Date of Patent: *Dec. 19, 2000

[54] DOUBLE HETEROJUNCTION LIGHT EMITTING DEVICE POSSESSING A DOPANT GRADIENT ACROSS THE N-TYPE LAYER

[75] Inventors: Yukio Matsumoto; Shunji Nakata; Yukio Shakuda, all of Kyoto, Japan

[73] Assignee: Rohm Co., Ltd., Kyoto, Japan

[*] Notice: This patent issued on a continued prosecution application filed under 37 CFR 1.53(d), and is subject to the twenty year patent term provisions of 35 U.S.C. 154(a)(2).

[21] Appl. No.: 09/079,262

[22] Filed: May 15, 1998

[51] Int. Cl.$^7$ .................................................... H01L 33/00
[52] U.S. Cl. .......................... 257/101; 257/103; 257/98; 257/201; 257/615; 257/97
[58] Field of Search .................................. 257/79, 94, 99, 257/101, 183, 191, 201, 613, 615, 96, 97

[56] References Cited

U.S. PATENT DOCUMENTS

| | | | |
|---|---|---|---|
| 5,153,889 | 10/1992 | Sugawara et al. | 372/45 |
| 5,202,895 | 4/1993 | Nitta et al. | 372/45 |
| 5,488,235 | 1/1996 | Nozaki et al. | 257/94 |
| 5,639,674 | 6/1997 | Nozaki et al. | 437/5 |
| 5,656,829 | 8/1997 | Sakaguchi et al. | 257/94 |
| 5,811,839 | 9/1998 | Shimoyama et al. | 257/94 |
| 5,814,838 | 9/1998 | Ohtsuka et al. | 257/94 |

Primary Examiner—Mahshid Saadat
Assistant Examiner—Bradley W. Baumeister
Attorney, Agent, or Firm—Arent Fox Kintner Plotkin & Kahn, PLLC

[57] ABSTRACT

An active layer is sandwiched between the n-type cladding layer and the p-type cladding layer, forming a light emitting layer forming portion. The n-type cladding layer has a carrier concentration of non-doped or less than $5 \times 10^{17}$ cm$^{-3}$ on a side thereof close to the active layer, and a carrier concentration of $7 \times 10^{17}$–$7 \times 10^{18}$ cm$^{-3}$ on a side thereof remote from the active layer. With this structure, it is possible to suppress to a minimum the deterioration of crystallinity at an interface between the active layer and the n-type cladding layer as well as in the active layer. thereby providing a semiconductor light emitting device high in brightness.

3 Claims, 4 Drawing Sheets

DOUBLE HETEROJUNCTION LIGHT EMITTING DEVICE POSSESSING A DOPANT GRADIENT ACROSS THE N-TYPE LAYER

FIELD OF THE INVENTION

This invention relates to a semiconductor light emitting device which is improved in semiconductor crystalline quality to have an enhanced light emitting efficiency, for use as a light source requiring high brightness, such as for outdoor displays and vehicular tail lamps and direction indicators, or a light source requiring high brightness but low in power consumption, such as for back-lights of battery-driven portable units such as handy telephones and indicator lamps, besides for optical communications or optical information processing.

BACKGROUND OF THE INVENTION

There is a conventional semiconductor light emitting device having a light emitting layer formed by using an AlGaInP-based compound semiconductor for emitting visible light, as disclosed, for example, in Japanese Laying-open Patent Publication No. H4-212479. This known semiconductor light emitting device is structured as shown in FIG. 4. In FIG. 4, the device includes an n-GaAs semiconductor substrate 21. On the semiconductor substrate 21 are epitaxially grown, in order, an n-type cladding layer 22 of an n-type AlGaInP-based compound semiconductor, an active layer 23 of a non-doped AlGaInP-based semiconductor material, and a p-type cladding layer 24 of a p-type AlGaInP-based compound semiconductor. Further, a p-type window layer (current diffusion layer) 25 is epitaxially grown of an AlGaAs-based semiconductor material. On the window layer 25 is formed an upper (p-side) electrode 27 through a p-type GaAs contact layer 26, while a lower (n-side) electrode 28 is formed on a backside of the semiconductor substrate 21. These electrodes 27, 28 are formed of an Au-Ge-Ni alloy or the like.

The light emitting device of this structure is arranged to confine carriers within the active layer 23 sandwiched between the respective cladding layers 22, 24. In order to enhance the light emitting efficiency, the respective cladding layers 22, 24 and the active layer 23 are each determined of a mixed crystal ratio in the AlGaInP-based compound semiconductor, constituting a doublehetero structure.

There have been various proposals on the carrier concentration for the p-type cladding layer 24 of this structure, such as in the above Japanese Laying-open Patent Publication No. H4-212479 which demonstrates that the carrier concentration be preferably $5 \times 10^{17} - 2 \times 10^{18}$. However, the n-type cladding layer 22 is formed at a carrier concentration of as high as approximately $1 \times 10^{18} 7 \times 10^{18}$ in order to reduce direct-current resistance.

SUMMARY OF THE INVENTION

Although there have been proposals for the p-type cladding layer to decrease the carrier concentration or the like in view of crystal lattice matching for improving light emitting efficiency, it has been considered for the n-type cladding layer that there exists almost no problem on crystalline lattice-matching. However, the present inventor have eagerly studied in order to further enhance the light emitting efficiency. As a result, it was found that, if the n-type cladding layer is excessively high in carrier concentration, the dopant thereof diffuses into the active layer during epitaxial growth. This deteriorates the crystallinity at the interface between the active layer and the n-type cladding layer as well as in the active layer, with the result that the light emitting efficiency is lowered and the brightness is difficult to increase.

It is an object of the present invention to provide a semiconductor light emitting device which is improved in light emitting efficiency and high in brightness without encountering deterioration of crystallinity at an interface between an active layer and an n-type cladding layer and in the active layer, based on the above-stated finding.

It is another object of the present invention to provide a method of manufacturing a semiconductor light emitting device by which the dopant In the n-type cladding layer is suppressed from diffusing into the active layer.

A semiconductor light emitting device according to the present invention, comprises: an n-type cladding layer; a p-type cladding layer; an active layer sandwiched between the n-type cladding layer and the p-type cladding layer and formed of a material having a bandgap energy lower than that of the cladding layer; and wherein the n-type cladding layer has a carrier concentration of non-doped or less than $5 \times 10^{17}$ cm$^{-3}$ on a side thereof close to the active layer, and a carrier concentration of $7 \times 10^{17} - 7 \times 10^{18}$ cm$^{-3}$ on a side thereof remote from the active layer. With this structure, there is almost no diffusion of an n-type impurity from the n-type cladding layer into the active layer, causing no deterioration of crystallinity in the active layer.

The n-type cladding layer may be formed to have a carrier concentration varied continuously or stepwisely in a thickness direction thereof. Further, said n-type cladding layer may be formed by a first n-type cladding layer provided on a side thereof close to said active layer to have a carrier concentration of non-doped or less than $5 \times 10^{17}$ cm$^{-3}$, and a second n-type cladding layer provided on a side thereof remote from said active layer to have a carrier concentration of $7 \times 10^{17} - 7 \times 10^{-}$cm$^{-3}$. Thus, the n-type cladding layer has carrier concentrations given at the respective sides as stated above.

The light emitting layer forming portion may be formed of an AlGaInP-based compound semiconductor, wherein a window layer is formed of an AlGaAs-based compound semiconductor at a location adjacent to said p-type cladding layer of said light emitting layer forming portion. The resulting semiconductor light emitting device is high in brightness for visible light.

Here, the AGaInP-based compound semiconductor means a material expressed by a formula $(Al_xGa_{1-x})_{0.51}In_{0.49}P$ wherein the value x is variable between 0 and 1. Note that the mixed-crystal ratio of $(Al_xGa_{1-x})$ to In, 0.51 to 0.49, means a ratio at which the AlGaInP-based compound semiconductor is matched in lattice to the semiconductor substrate such as of GaAs. Also, the AlGaAs-based compound semiconductor means a material expressed by a formula $Al_yGa_{1-y}As$ wherein the value y is variable between 0 and 1.

It is possible to further provide a protecting layer formed of an AlGaAs-based compound semiconductor having an Al mixed crystal ratio lower than that of said window layer, on a surface of said window layer. This is preferred because the semiconductor layer exposed at a surface has a less Al mixed crystal ratio and is stable against moisture or the like.

Also, a method of manufacturing a semiconductor light emitting device according to the present invention, comprises the steps of: epitaxially growing an n-type cladding layer on a semiconductor substrate by decreasing an amount of a dopant or raising a growth temperature as the growth thereof advances so as to decrease a carrier concentration on a side of a surface thereof; epitaxially growing a non-doped active layer on the surface of said n-cladding layer; and further epitaxially growing a p-type cladding layer.

For a fuller understanding of the nature and advantages of the invention, reference should be made to the ensuing detailed description taken in conjunction with the accompanying drawings.

DETAILED DESCRIPTION

Figure 1:
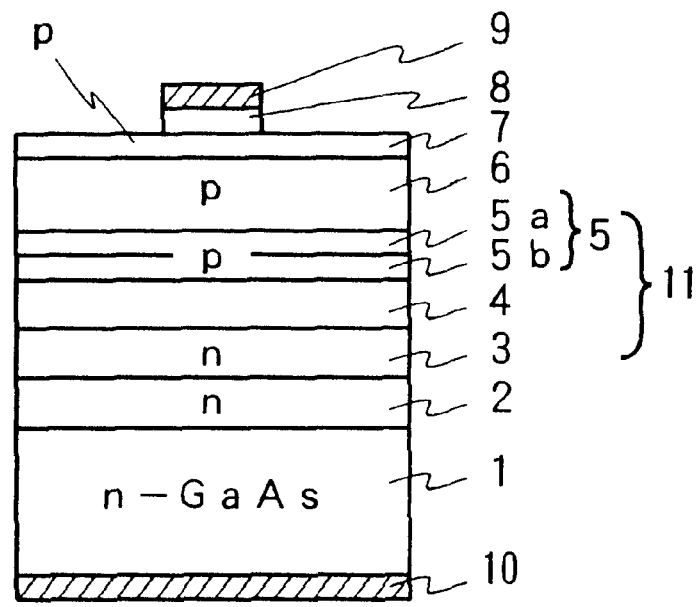
FIGS. 1(a)–1(b) are a sectional structural view of a semiconductor light emitting device according to one embodiment of the present invention, and a graph showing a carrier concentration profile for an n-type cladding layer of the same device.
Figure 1:
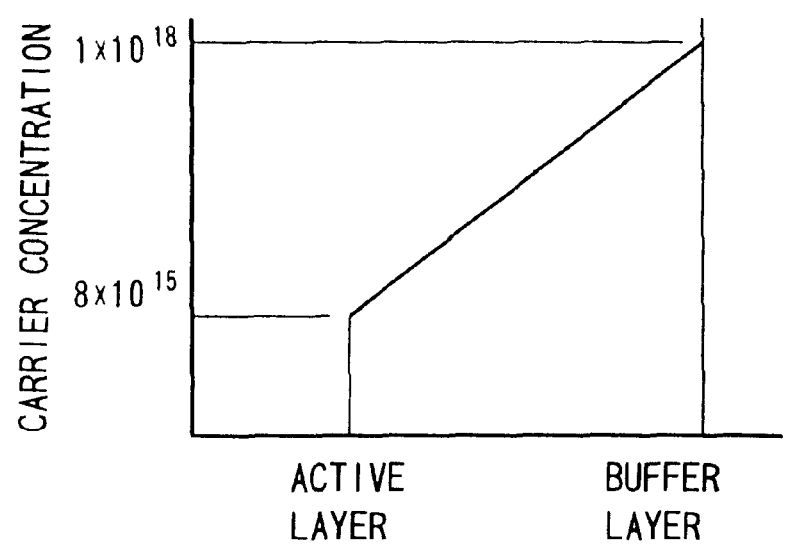

The present inventors have eagerly studied in order to enhance the light emitting efficiency of a semiconductor light emitting device. As a result, it was found that the cause of difficulty in enhancing the light emitting efficiency in the conventional semiconductor light emitting device lies in that the crystallinity at the interface of the cladding layer and the n-type cladding layer is caused to deteriorate due to the high concentration of a dopant contained in the n-type cladding layer during epitaxial growth. Under such a situation, the present inventors have further studied on the condition under which the active layer is less affectable by the dopant in the n-type cladding layer. As a result, it was found that the deterioration in crystallinity at the interface of the active layer and the n-type layer as well as at the active layer due to dopant diffusion is suppressed to a minimum extent, thereby providing a semiconductor light emitting device with high brightness.

Referring to Fig. 1(a)–1(b), there are respectively illustrated a sectional view of a semiconductor light emitting device according to the present invention and a profile of a carrier concentration in an n-type layer thereof. That is, an n-type GaAs substrate has various semiconductor layers epitaxially grown, in order, thereon by an MOCVD (Metal Organic Chemical Vapor Deposition), for example.

First, a buffer layer 2 is grown of GaAs doped, for example, with Se to a carrier concentration of approximately $7 \times 10^{17} - 5 \times 10^{18}$ cm$^{-3}$, in a thickness of approximately 0.1 μm. Then, an n-type cladding layer 3 is grown of an AlGaInP-based compound semiconductor (e.g. with an Al mixed crystal ratio of 0.7) doped with Se as a dopant to such a carrier concentration that varies continuously from $7 \times 10^{17} - 7 \times 10^{18}$ cm$^{-3}$ ($1 \times 10^{18}$ cm$^{-3}$ in FIG. 1(b)) at the buffer layer 2 to less than $5 \times 10^{17}$ cm$^{-3}$ ($8 \times 10^{15}$ cm$^{-3}$ in FIG. 1(b)) at an active layer 4, to a thickness of approximately 0.3–1 μm as shown in FIG. 1(b).

An active layer 4 is grown of a non-doped AlGaInP-based compound semiconductor (e.g. with an Al mixed crystal ratio of 0.25) having a bandgap energy lower than that of the cladding layer, in a thickness of approximately 0.4–1 μm. Further, a p-type cladding layer 5 is grown, which has a first sublayer 5a with a thickness of approximately 0.5–1 μm doped with Zn to a carrier concentration of approximately $3 \times 10^{16} - 7 \times 10^{16}$ cm$^{-3}$ and a second sublayer 5b with a thickness of approximately 0.5–1 μm doped to a carrier concentration of approximately $5 \times 10^{17} - 2 \times 10^{18}$ cm$^{-3}$.

Further, a window layer 6 is grown of an AlGaAs-based compound semiconductor (with an Al mixed crystal ratio of 0.6–0.8, e.g. 0.7) auto-doped to a carrier concentration of approximately $5 \times 10^{18} - 3 \times 10^{19}$ cm$^{-3}$, in a thickness of approximately 5–7 μm. Then, a protecting layer 7 is grown of an AlGaAs-based compound semiconductor having an Al mixed crystal ratio (i.e. of 0.45–0.6, e.g. 0.5) lower than that of the window layer 6, in a thickness of approximately 0.4–1 μm. Finally, a contact layer 8 is grown of GaAs doped with Zn to a carrier concentration of approximately $1 \times 10^{19} - 1 \times 10^{20}$ cm$^{-3}$. Note that the n-type dopant may employ Si or Te or Si and Se in place of Se mentioned above.

The p-type cladding layer structure having the first layer 5a with a lower carrier concentration and the second layer 5b with a higher carrier concentration serves to reduce the influence of diffusing a p-type dopant into the active layer 4, maintaining the crystallinity. This structure also serves to prevent voltage drop caused due to a hetero-barrier at an interface with the window layer having a higher carrier concentration, improving the light emitting characteristics.

An upper (p-side) electrode 9 is formed of an Au-Ti alloy, an Au-Zn-Ni alloy or the like on the contact layer 8 on a surface side of the semiconductor layers thus formed, while an lower (n-side) electrode 10 is formed of an Au-Ge-Ni alloy or the like on the backside of the GaAs substrate 1. Note that the active layer 4 and the respective cladding layers 3, 5, cooperatively constituting a light emitting layer forming portion, is of a double-hetero structure arranged different in Al mixed crystal ratio and hence a bandgap energy lying between the active and cladding layers in order to enhance carrier or light confinement within the active layer.

To manufacture a semiconductor light emitting device constructed as above, a GaAs substrate, e.g. of an n-type, is placed within an MOCVD reactor. Introducing into the reactor a reacting gas of triethyl gallium (hereinafter referred to as TEG) or trimethyl gallium (hereinafter referred to as TMG) and arsine (hereinafter referred to as AsH$_3$) and an Se dopant gas of H$_2$Se, together with a hydrogen (H$_2$) carrier gas, a buffer layer 2 is film-formed of an n-type GaAs doped with Se to a carrier concentration of approximately $7 \times 10^{17} - 5 \times 10^{18}$ cm$^{-3}$, to a thickness of approximately 0.1 μm. Then, TMA and trimethyl indium (hereinafter referred to as TMIn) are further introduced to epitaxially grow an n-type cladding layer 3, e.g. of (Al$_{0.7}$Ga$_{0.3}$)$_{0.51}$In$_{0.49}$P to a thickness of approximately 0.3–1 μm. At this time, the dopant gas H$_2$Se is gradually decreased such that a carrier concentration on a buffer-layer 2 side is at $7 \times 10^{17} - 7 \times 10^{18}$ cm$^{-3}$ ($1 \times 10^{18}$ cm$^{-3}$ in FIG. 1(b) example) and a carrier concentration on an active-layer 4 side is at $5 \times 10^{17}$ cm$^{-3}$ or less (approximately $8 \times 10^{15}$ cm$^{-3}$ in FIG. 1(b) example). The reacting gas TMA is decreased to increase TEG to form an active layer 4 of non-doped (Al$_{0.25}$Ga$_{0.75}$)$_{0.51}$In$_{0.49}$P to a thickness of approximately 0.4–1 μm. Using a reacting gas same as that for the n-type cladding layer but replacing the dopant gas to dimethyl zinc (hereinafter referred to as DMZn) to epitaxially grow a first layer 5a to a carrier concentration of $3 \times 10^{16} - 7 \times 10^{16}$ cm$^{-3}$ and a second layer 5b to a carrier concentration of $5 \times 10^{17} - 2 \times 10^{18}$ cm$^{-3}$, each to a thickness of approximately 0.5–1 μm.

Further, the reacting gas is changed to TEG and TMA and AsH$_3$ with the dopant gas stopped of supply, a window layer 6 is formed, for example, of Al$_{0.7}$Ga$_{0.3}$As doped with C to a carrier concentration of approximately $5 \times 10^{18} - 3 \times 10^{19}$ cm$^{-3}$, to a thickness of approximately 5–7 μm. Decreasing TMA and introducing DMZn, a protecting layer 7 is formed, for example, of $Al_{0.5}Ga_{0.5}As$ to a carrier concentration of approximately $1\times10^{19}$–$4\times10^{19}$ cm$^{-3}$, to a thickness of approximately 0.4–1 μm. Then TMA is stopped of supply to introduce DMZn to form a contact layer 8 of p-type GaAs to a carrier concentration of approximately $1\times10^{19}$–$1\times10^{20}$ cm$^{-3}$, to a thickness of approximately 0.3–0.5 μm.

An upper (p-side) electrode 9 is formed of an Au-Ti alloy, an Au-Zn-Ni alloy or the like on a top surface of the semiconductor layers thus grown on the substrate, while a lower (n-side) electrode 10 is formed of a Au-Ge-Ni alloy or the like. The substrate thus processed is then sawed into individual chips.

In the above embodiment, the n-type cladding layer was varied in carrier concentration such that the carrier concentration is gradually decreased by gradually decreasing the flow rate of the dopant gas supplied during epitaxial growth. Alternatively, the gradual decrease in carrier concentration can be achieved by gradually raising the growth temperature with the dopant gas maintained constant. The control of carrier concentration by varying the growth temperature provides an advantage of improving the crystallinity, whereas the carrier concentration control by varying the dopant-gas flow rate offers a merit that the carrier concentration is easy to control. It is of course possible to adopt both the control ways at the same time.

According to the present invention, since the n-type cladding layer has a decreased carrier concentration on a side close to the active layer, there is no possibility that the n-type dopant existing in the n-type cladding layer be diffused toward the active layer to cause deterioration of crystallinity in the active layer or at the interface between the active layer and the n-type cladding layer, during epitaxially growing other semiconductor layers. The region of low carrier concentration occupies only part of the n-cladding layer, and has no effects on series resistance or carrier confining amount. Accordingly, electric characteristics and brightness are improved, and a semiconductor light emitting device with high light emitting efficiency is obtained.

Figure 2:
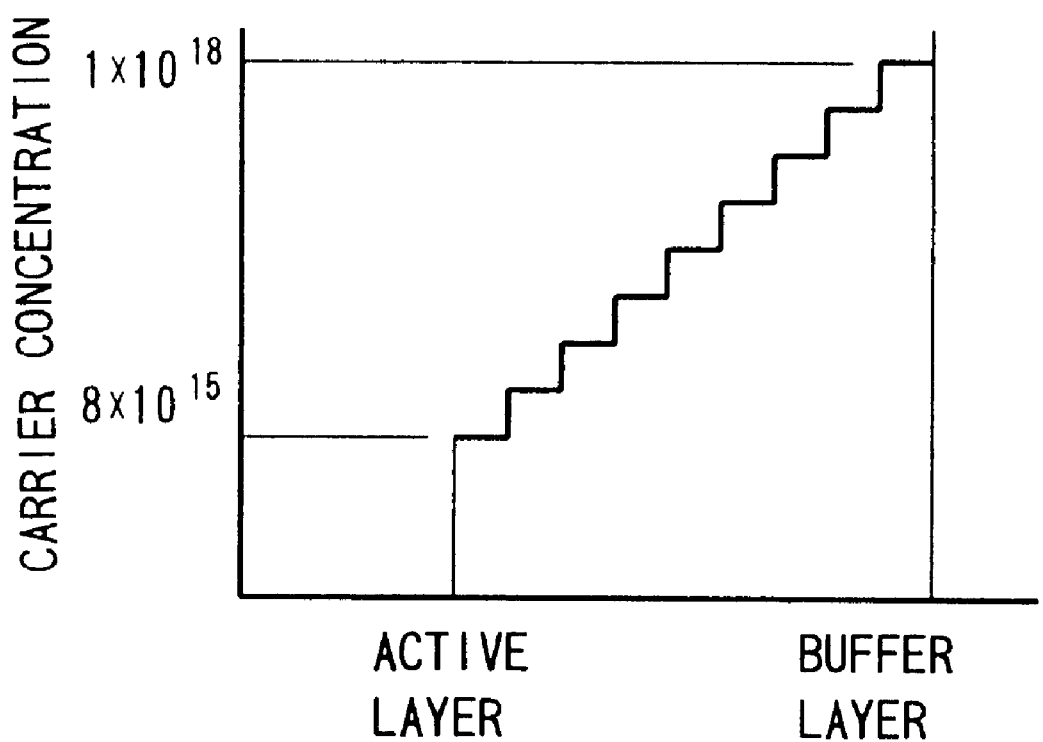
FIG. 2 is a graph showing another example of a carrier concentration profile for the n-type cladding layer.

In this manner, the semiconductor light emitting device of the present invention has the n-type cladding layer decreased low in carrier concentration on the side of the active layer. However, the carrier concentration in the n-type cladding layer is not limited in profile to the continuous variation as shown in FIG. 1(b). That is, the carrier concentration may be stepwisely varied as shown in FIG. 2 such that it decreases toward the active layer side and increases toward the side opposite thereto. To stepwisely change the carrier concentration in this manner, the flow rate in the dopant gas supply may be stepwisely varied or the growth temperature may be stepwisely changed.

Figure 3:
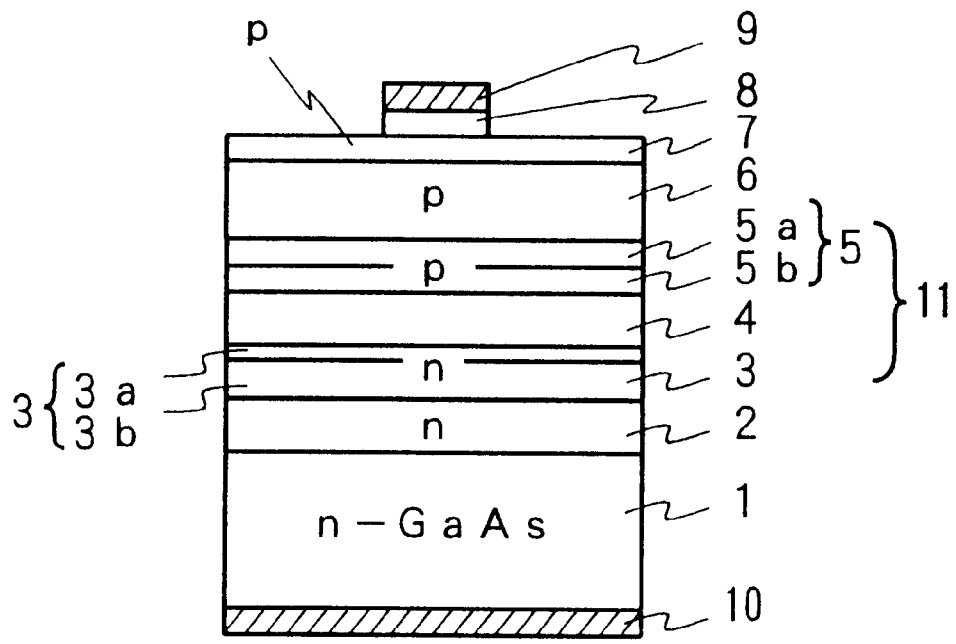
FIGS. 3(a)–3(b) are a sectional structural view of a semiconductor light emitting device according to another embodiment of the present invention, and a graph showing a carrier concentration profile for an n-type layer of the same device.
Figure 3:
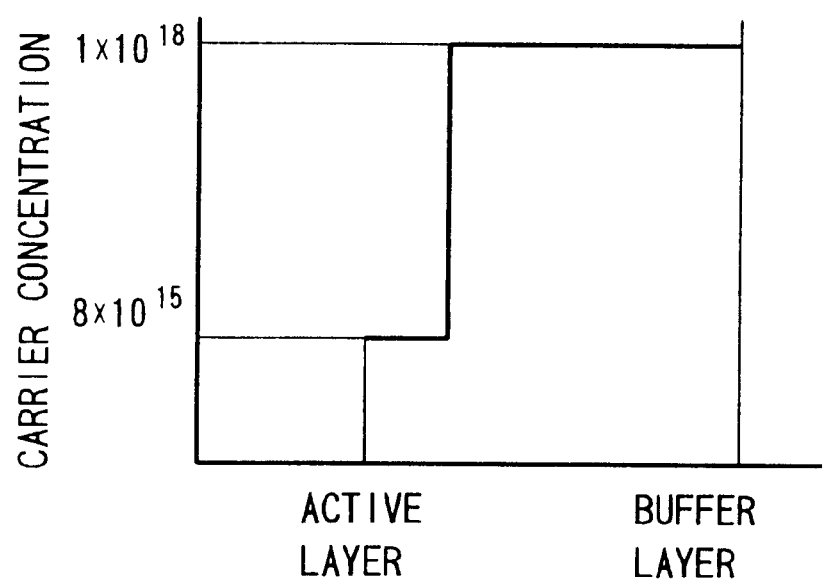
Figure 4:
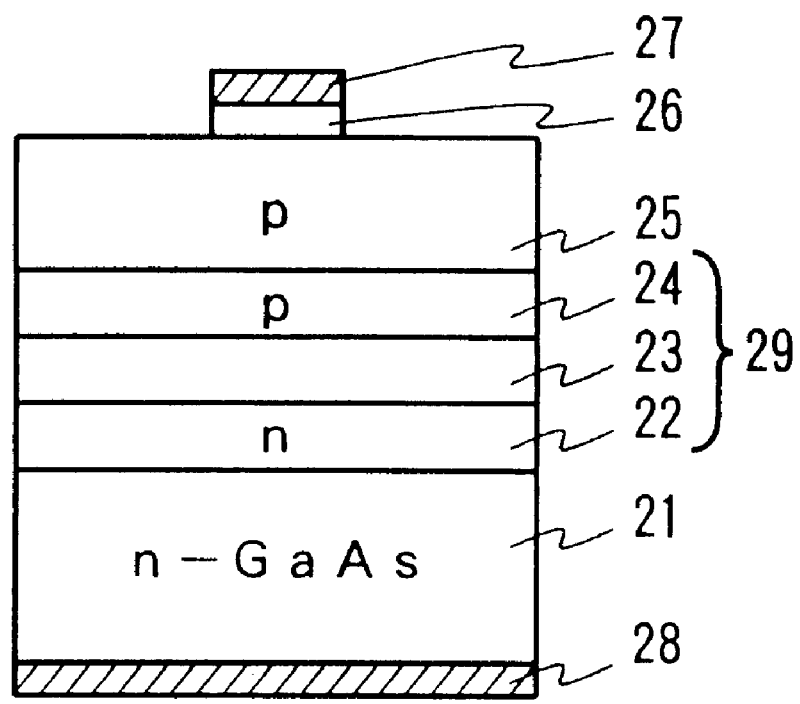
FIG. 4 is a sectional structural view of a conventional semiconductor light emitting device.

Referring to FIGS. 3(a)–3(b), there are respectively shown a sectional structural view of a light emitting chip according to another embodiment of the present invention and a carrier concentration profile for the n-type cladding layer of the same chip. This embodiment has, on the active layer side, a first n-type cladding layer 3a with a decreased carrier concentration, and, as the remaining portion, a second n-type cladding layer 3b with a carrier concentration almost equivalent to the conventional. With this structure, the carrier concentration can be reduced on the active layer 4 side, and the operation is similar to the above embodiment. When the first n-type cladding layer 3a with low carrier concentration was limited, for example, to approximately 0.2–0.5 μm in this structure, the effect alike the above embodiment was obtained. Incidentally, In FIG. 3 the part corresponding to those of FIG. 1 are denoted by the same reference numerals.

In the above embodiments the semiconductor layers for the semiconductor light emitting device were explained by exemplifying a specific semiconductor material having a particular thickness and carrier concentration. However, the present invention is not limited to these examples provided that the invention is applied to a semiconductor light emitting device of a doublehetero-structure having an active layer sandwiched between the cladding layers to constitute a light emitting layer forming portion. It is needless to say that other materials are similarly applicable.

According to the present invention, it is possible to obtain a semiconductor light emitting device high in light emitting efficiency and brightness without lowering the crystallinity in the active layer. The resulting semiconductor light emitting device can be use as a light emitting element requiring high brightness, such as for outdoor displays and vehicular tail or stop lamps, or a light-source light emitting element high in brightness but low in power consumption, such as battery-driven portable units such as handy telephones.

Although preferred embodiments have been described in some detail, it is to be understood that certain changes can be made by those skilled in the art without departing from the spirit and scope of the invention as defined by the appended claims.

What is claimed is:

1. A semiconductor light emitting device, comprising:

an n-type cladding layer;

a p-type cladding layer;

an active layer sandwiched between said n-type cladding layer and said p-type cladding layer and formed of a material having a bandgap energy lower than that of said cladding layers; and wherein said n-type cladding layer has a carrier concentration of non-doped or less than $5\times10^{17}$ cm$^{-3}$ on a side thereof close to said active layer, and a carrier concentration of $7\times10^{17}$–$7\times10^{18}$ cm$^{-3}$ on a side thereof remote from said active layer and said p-type cladding layer has a carrier concentration of $3\times10^{16}$ to $7\times10^{16}$ cm$^{-3}$ on the side of said active layer and a carrier concentration of $5\times10^{17}$ to $2\times10^{18}$ cm$^{-3}$ on a side thereof remote from said active layer, wherein a light emitting layer forming portion is constituted by said n-type cladding layer, said p-type cladding layer, and said active layer sandwiched between said n-type and p-type cladding layers, said light emitting layer forming portion being formed of an AlGaInP-based compound semiconductor, wherein a window layer is formed of an AlGaAs-based compound semiconductor at a location adjacent to said p-type cladding layer of said light emitting layer forming portion, and a protecting layer formed of an $Al_xGa_{1-x}As$ ([0.45<] 0.5<x<0.6) semiconductor having an Al ratio within the crystal lower than that of said window layer, on an entire surface of said window layer.

2. A semiconductor light emitting device according to claim 1, wherein said n-type cladding layer is formed to have a carrier concentration varied continuously or stepwisely in a thickness direction thereof.

3. A semiconductor light emitting device according to claim 1, said n-type cladding layer is formed by a first n-type cladding layer provided on a side thereof close to said active layer to have a carrier concentration of non-doped or less than $5\times10^{17}$ cm$^{-3}$, and a second n-type cladding layer provided on a side thereof remote from said active layer to have a carrier concentration of $7\times10^{17}\times7\times10^{18}$ cm$^{-3}$.

* * * * *

UNITED STATES PATENT AND TRADEMARK OFFICE
CERTIFICATE OF CORRECTION

PATENT NO. : 6,163,037
DATED : December 19, 2000
INVENTOR(S) : Matsumoto et al.

It is certified that error appears in the above-identified patent and that said Letters Patent is hereby corrected as shown below:

Title page,
Insert Item -- [30]    Foreign Application Priority Data
    May 15, 1997    (JP)......................................... 9-125167 --.

Signed and Sealed this

Fourth Day of January, 2005

JON W. DUDAS
*Director of the United States Patent and Trademark Office*